(12) United States Patent
Gan et al.

(10) Patent No.: US 8,884,657 B2
(45) Date of Patent: Nov. 11, 2014

(54) SWITCH-DRIVING CIRCUIT (71) Applicant: Delta Electronics, Inc., Taoyuan Hsien (TW)

(72) Inventors: Hong-Jian Gan, Taoyuan Hsien (TW); Wei-Liang Fu, Taoyuan Hsien (TW); Ming Wang, Taoyuan Hsien (TW); Jian-Ping Ying, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 74 days.

(21) Appl. No.: 13/732,811

(22) Filed: Jan. 2, 2013

(65) Prior Publication Data

US 2014/0049295 A1 Feb. 20, 2014

(30) Foreign Application Priority Data

Aug. 20, 2012 (CN) .......................... 2012 1 0297466

(51) Int. Cl.
*H03B 1/00* (2006.01)
*H03K 3/00* (2006.01)
*H03K 17/691* (2006.01)

(52) U.S. Cl.
CPC .................................. *H03K 17/691* (2013.01)
USPC .......................................... 327/108; 327/112

(58) Field of Classification Search
None
See application file for complete search history.

(56) References Cited

U.S. PATENT DOCUMENTS

| 6,344,768 | B1 * | 2/2002 | Daun-Lindberg et al. ..... 327/424 |
| 6,836,161 | B2 * | 12/2004 | Akiyama et al. ............... 327/108 |
| 2013/0063184 | A1 * | 3/2013 | Liang et al. .................... 327/108 |
| 2013/0099831 | A1 * | 4/2013 | Permuy et al. ................. 327/109 |
| 2013/0200865 | A1 * | 8/2013 | Wimpenny ..................... 323/271 |
| 2013/0271187 | A1 * | 10/2013 | Hayashi et al. ................ 327/109 |

FOREIGN PATENT DOCUMENTS

| CN | 201536357 U | 7/2010 |
| CN | 101834063 A | 9/2010 |
| CN | 101951175 A | 1/2011 |
| CN | 201742315 U | 2/2011 |
| CN | 102280990 A | 12/2011 |
| JP | 4213565 B2 | 1/2009 |

* cited by examiner

*Primary Examiner* — Tuan T Lam
(74) *Attorney, Agent, or Firm* — Tim Tingkang Xia, Esq.; Morris, Manning & Martin, LLP (57) ABSTRACT A switch-driving circuit suitable for driving a full-controlled power switch combination is disclosed. The switch-driving circuit includes a first pulse-width modulator, a high-voltage isolation pulse transformer module and a plurality of output modules. The high-voltage isolation pulse transformer module includes a magnetic core connected to multiple output modules in a one-to-many way, or includes multiple magnetic cores connected to multiple output modules in a one-to-one way. Each output module includes a second pulse-width modulator and a driving-power amplifier. The full-controlled power switch combination includes a plurality of full-controlled power switches. The driving-power amplifier is coupled between the second pulse-width modulator and one of the full-controlled power switches.

7 Claims, 7 Drawing Sheets

SWITCH-DRIVING CIRCUIT

RELATED APPLICATIONS

This application claims priority to China Application Serial Number 201210297466.3, filed Aug. 20, 2012, which is herein incorporated by reference.

BACKGROUND

1. Technical Field

The present disclosure relates to a switch-driving circuit. More particularly, the present disclosure relates to a switch-driving circuit for driving a full-controlled power switch component.

2. Description of Related Art

In the area of a high-power electronic device (e.g., an industrial computer, a server, an electricity equipment, etc), the reliability of the product is required seriously. The mean time between failures (MTBF) is an index used for measuring the reliability of the product. If the electronic device has a longer MTBF, it means that the electronic device is more reliable.

In a traditional power supply of the electronic device, the control signals are usually transmitted via optical fibers to the high-voltage side, so as to control the power switch components at the high-voltage side and the output stage of the power supply. Using the optical fiber transmission instead of an electrical wiring connection may achieve the electrical isolation between the high-voltage side and the low-voltage side, and also between the power switch components at the high-voltage side, so as to avoid the electricity noise interference in between.

However, the optical fibers generally have much shorter MTBF compared to the MTBF of other electronic components within the electronic system. Therefore, the optical fibers become a bottleneck to elevate the reliability of the whole electronic system.

Secondly, each power switch component at the high-voltage side must be isolated from the low-voltage side and isolated from other power switch components at the high-voltage side as well. In this case, each power switch component requires an individual set of optical fibers for transmitting its own control signal. Therefore, the transmission over optical fibers will significantly increase the costs and complexity of the system.

In addition, the signal transmission over optical fibers may lead to longer delay time, such that the synchronization between signals will be poor. When the system requires highly synchronized signals, the signal transmission over optical fibers may cause some issues in the stability of power switch components.

Utilizing a magnetic isolation structure, instead of the optical fibers, for transmitting the driving signal and realizing the electrical isolation can boost the system stability, reduce system costs, simplify the system structure, shorten the delay time and enhance the synchronization between signals, so as to solve most issues existed in the optical fiber isolation structure.

The traditional design of driving circuits coupled to half-controlled power switch components adopt the magnetic isolation structure for transmitting driving signals of switch units. For example, the driving signals at low-voltage side transmits through a transformer, so as to induce triggering pulses to multiple half-controlled power switch components connected in series at the high-voltage side. The Silicon Controlled Rectifier (SCR) is one common example of the half-controlled power switch components.

Based on the characteristic of the half-controlled power switch components, the Silicon Controlled Rectifiers have some requirement on their driving signals: (1) only narrow pulse-width signals are required to trigger and turn on the SCR (the signals for turning off are not necessary, because the half-controlled power switch components can not be turned off through the driving signals); and (2) the pulse transformer can be used to transmit the driving signals and the driving-power at the same time, because the driving signals for the half-controlled power switch components have narrow pulse-widths.

On the other hand, the full-controlled power switch components also have some requirements on their driving signals, which the requirements are different from ones of the half-controlled power switch components, for example: (1) turning on and off the full-controlled power switch component can be controlled by the driving signal; (2) the full-controlled power switch component requires a stable high voltage-level while the switch component is on, and require a stable low voltage-level while it is off; and (3) the driving signal of the full-controlled power switch component must have a longer pulse-width relative to the driving signal of the half-controlled power switch component. Therefore, the driving signal and the driving-power must be transmitted separately on the full-controlled power switch component.

Therefore, the traditional technology for transmitting the driving signal of the half-controlled power switch component can not be applied on the full-controlled power switch component.

SUMMARY

In order to solve the aforesaid problem, this disclosure provides a switch-driving circuit capable of transmitting driving signals to a full-controlled power switch combination in a magnetic isolation way, so as to provide fast-response, stable and reliable driving signals to the full-controlled power switch combination.

An aspect of the disclosure is to provide a switch-driving circuit suitable for driving a full-controlled power switch combination. The switch-driving circuit includes a first pulse-width modulator, a high-voltage isolation pulse transformer module and a plurality of output modules. The high-voltage isolation pulse transformer module includes a magnetic core, a primary winding and a plurality of secondary windings. The primary winding and the secondary windings are wound on the magnetic core. The primary winding is coupled to the first pulse-width modulator. Each output module includes a second pulse-width modulator and a driving-power amplifier. Each secondary side winding is coupled to the second pulse-width modulators of each output module respectively. The full-controlled power switch combination includes a plurality of full-controlled power switches. The driving-power amplifier is coupled between the second pulse-width modulator and one of the full-controlled power switches.

According to an embodiment of this disclosure, the full-controlled power switches of the full-controlled power switch combination are connected in series, or connected in a single-phase full-bridge circuit as an upper switch on one bridge arm and a lower switch on another bridge arm. The output modules generate a plurality of driving output signals to the full-controlled power switches. The driving output signals are in the same phase and isolated from each other.

According to an embodiment of this disclosure, a driving input signal is transmitted to an input terminal of the switch-driving circuit. The first pulse-width modulator is coupled to the input terminal for transforming the driving input signal into a narrow pulse-width signal. In aforesaid embodiment, the driving input signal is a pulse-width modulation (PWM) signal. The narrow pulse-width signal includes a plurality of positive pulses and a plurality of negative pulses. The positive pulses correspond to a plurality of rising edges of the driving input signal. The negative pulses correspond to a plurality of falling edges of the driving input signal.

Another aspect of the disclosure is to provide a switch-driving circuit suitable for driving a full-controlled power switch combination. The full-controlled power switch combination includes a plurality of full-controlled power switches. The switch-driving circuit includes a first pulse-width modulator, a high-voltage isolation pulse transformer module and a plurality of output modules. The high-voltage isolation pulse transformer module includes many magnetic cores, a plurality of primary windings and a plurality of secondary windings. Each primary winding and each secondary winding are wound on one of the magnetic cores. The primary windings are coupled to the first pulse-width modulator. Each output module includes a second pulse-width modulator and a driving-power amplifier. Each secondary side winding is coupled to the second pulse-width modulators of each output module respectively. The driving-power amplifier is coupled between the second pulse-width modulator and one of the full-controlled power switches.

According to an embodiment of this disclosure, the full-controlled power switches of the full-controlled power switch combination are connected in series, or connected in a single-phase full-bridge circuit as an upper switch on one bridge arm and a lower switch on another bridge arm. The output modules generate a plurality of driving output signals to the full-controlled power switches. The driving output signals are in the same phase and isolated from each other.

According to an embodiment of this disclosure, a driving input signal is transmitted to an input terminal of the switch-driving circuit. The first pulse-width modulator is coupled to the input terminal for transforming the driving input signal into a narrow pulse-width signal. In aforesaid embodiment, the driving input signal is a pulse-width modulation (PWM) signal. The narrow pulse-width signal includes a plurality of positive pulses and a plurality of negative pulses. The positive pulses correspond to a plurality of rising edges of the driving input signal. The negative pulses correspond to a plurality of falling edges of the driving input signal.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following description, several specific details are presented to provide a thorough understanding of the embodiments of the present invention. One skilled in the relevant art will recognize, however, that the present invention can be practiced without one or more of the specific details, or in combination with other components, etc. In other instances, well-known implementations or operations are not shown or described in detail to avoid obscuring aspects of various embodiments of the present invention.

Figure 1:
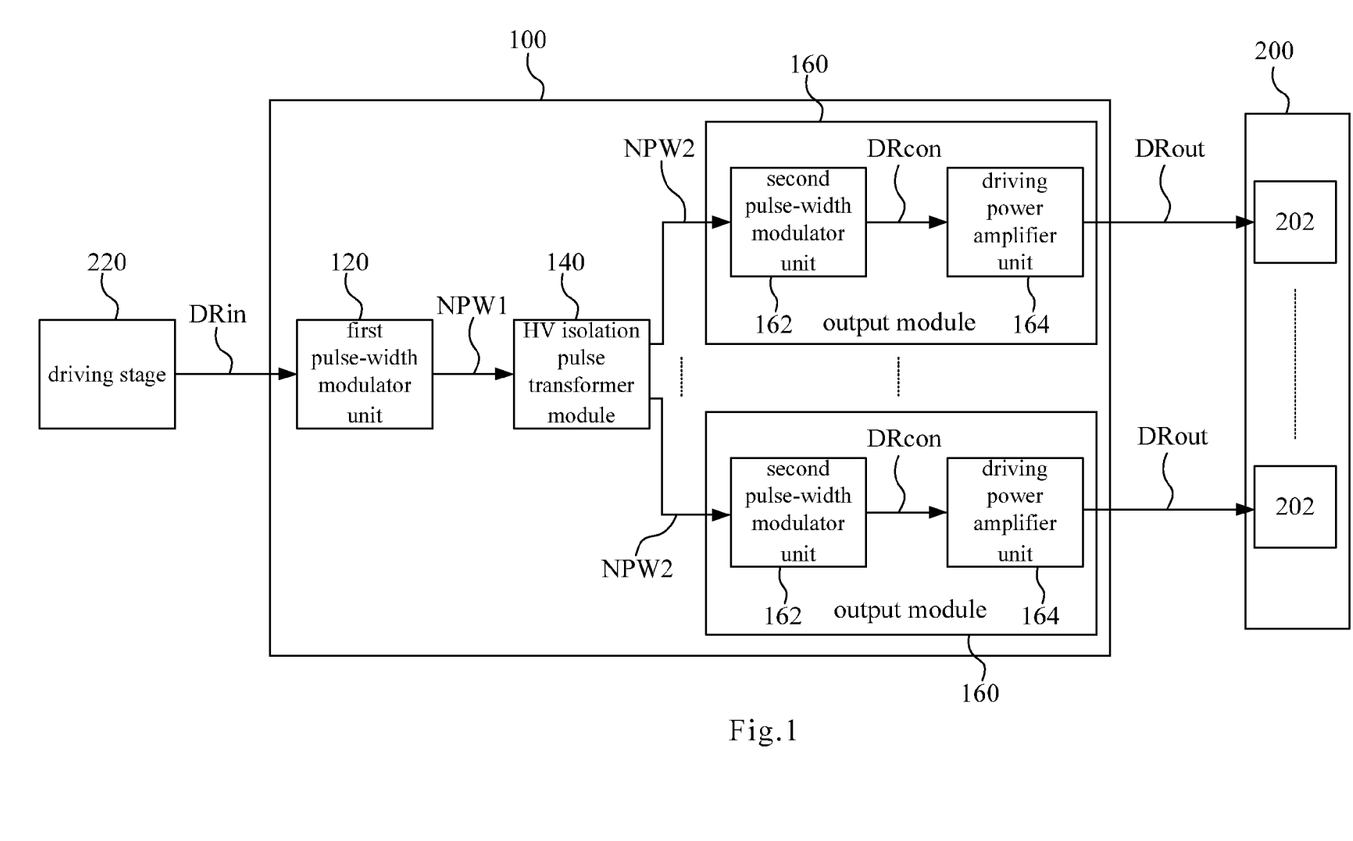
FIG. 1 is a function block diagram illustrating a switch-driving circuit according to an embodiment of the disclosure.

Reference is made to FIG. 1, which is a function block diagram illustrating a switch-driving circuit 100 according to an embodiment of the disclosure. As shown in FIG. 1, the switch-driving circuit 100 includes a first pulse-width modulator 120, a high-voltage isolation pulse transformer module 140 and a plurality of output modules 160. The switch-driving circuit 100 is coupled between a driving stage 220 and a full-controlled power switch combination 200, and used for transforming a driving input signal DRin provided by the driving stage 220 into multiple driving output signals DRout isolated from each other. The driving output signals DRout are utilized to control multiple full-controlled power switches 202 within the full-controlled power switch combination 200. In an embodiment of the disclosure, the full-controlled power switches 202 can be Insulated Gate Bipolar Transistors (IGBT).

For the brevity in explanations, this disclosure illustrates two output modules 160 and two full-controlled power switches 202 for demonstration, but the disclosure is not limited thereto. According to applications in practice, the switch-driving circuit 100 may include N output modules 160 corresponding to N full-controlled power switches 202, in which N is a positive integer of 2 or greater.

The switch-driving circuit 100 utilizes the high-voltage isolation pulse transformer module 140 to perform magnetic isolation between the input driving signal DRin and each output driving signal DRout, so as to prevent the interference between the input driving signal DRin and the output driving signal DRout. In addition, the switch-driving circuit 100 utilizes the high-voltage isolation pulse transformer module 140 to perform magnetic isolation between multiple output driving signals DRout, so as to prevent the interference between one output driving signal DRout and another output driving signal DRout.

Figure 2:
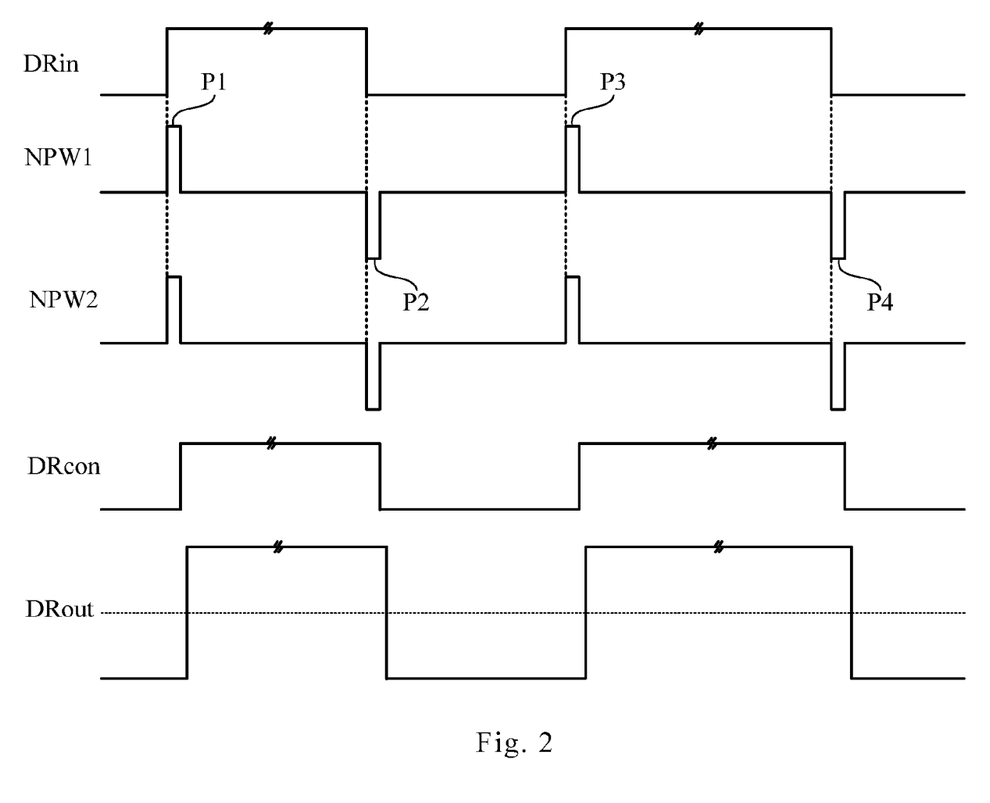
FIG. 2 is a schematic diagram illustrating waveforms of signals on the switch-driving circuit according to an embodiment of the disclosure.

Reference is also made to FIG. 2, which is a schematic diagram illustrating waveforms of signals on the switch-driving circuit 100 according to an embodiment of the disclosure. In the embodiment shown in FIG. 2, the driving stage 220 provides the driving input signal DRin to the input terminal of the switch-driving circuit 100. The first pulse-width modulator 120 is coupled to the input terminal of the switch-driving circuit 100. In the embodiment, the driving input signal DRin is a pulse-width modulation (PWM) signal, and the first pulse-width modulator 120 is used for transforming the driving input signal DRin into a narrow pulse-width signal NPW1. The narrow pulse-width signal includes a plurality of positive pulses (e.g., the positive pulses P1 and P3 shown in FIG. 2) and a plurality of negative pulses (e.g., the negative pulses P2 and P4 shown in FIG. 2). The positive pulses (P1, P3) correspond to a plurality of rising edges of the driving input signal DRin. The negative pulses (P2, P4) correspond to a plurality of falling edges of the driving input signal DRin. As shown in FIG. 2, the narrow pulse-width signal NPW1 transformed by the first pulse-width modulator 120 is transmitted to the primary side of the high-voltage isolation pulse transformer module 140.

Based on the narrow pulse-width signal NPW1 on the primary side, the high-voltage isolation pulse transformer module 140 forms multiple narrow pulse-width signals NPW2 on the secondary side in the magnetic induction way, and transmits the narrow pulse-width signals NPW2 to the output modules 160, so as to realize the magnetic isolation between the primary side (i.e., the low-voltage side in some embodiments) and the secondary side (i.e., the high-voltage side in some embodiments).

Each of the narrow pulse-width signals NPW2 is transmitted to a second pulse-width modulator 162 in each output module 160. Each of the second pulse-width modulators 162 is used for transforming the narrow pulse-width signal NPW2 into a driving control signal DRcon in a pulse-width modulation (PWM) format. Afterward, a driving-power amplifier 164 in each output module 160 is used for amplifying the driving control signal DRcon, and accordingly generating a driving output signal DRout with positive/negative driving levels to one of the full-controlled power switches 202 in the full-controlled power switch combination 200.

Figure 3:
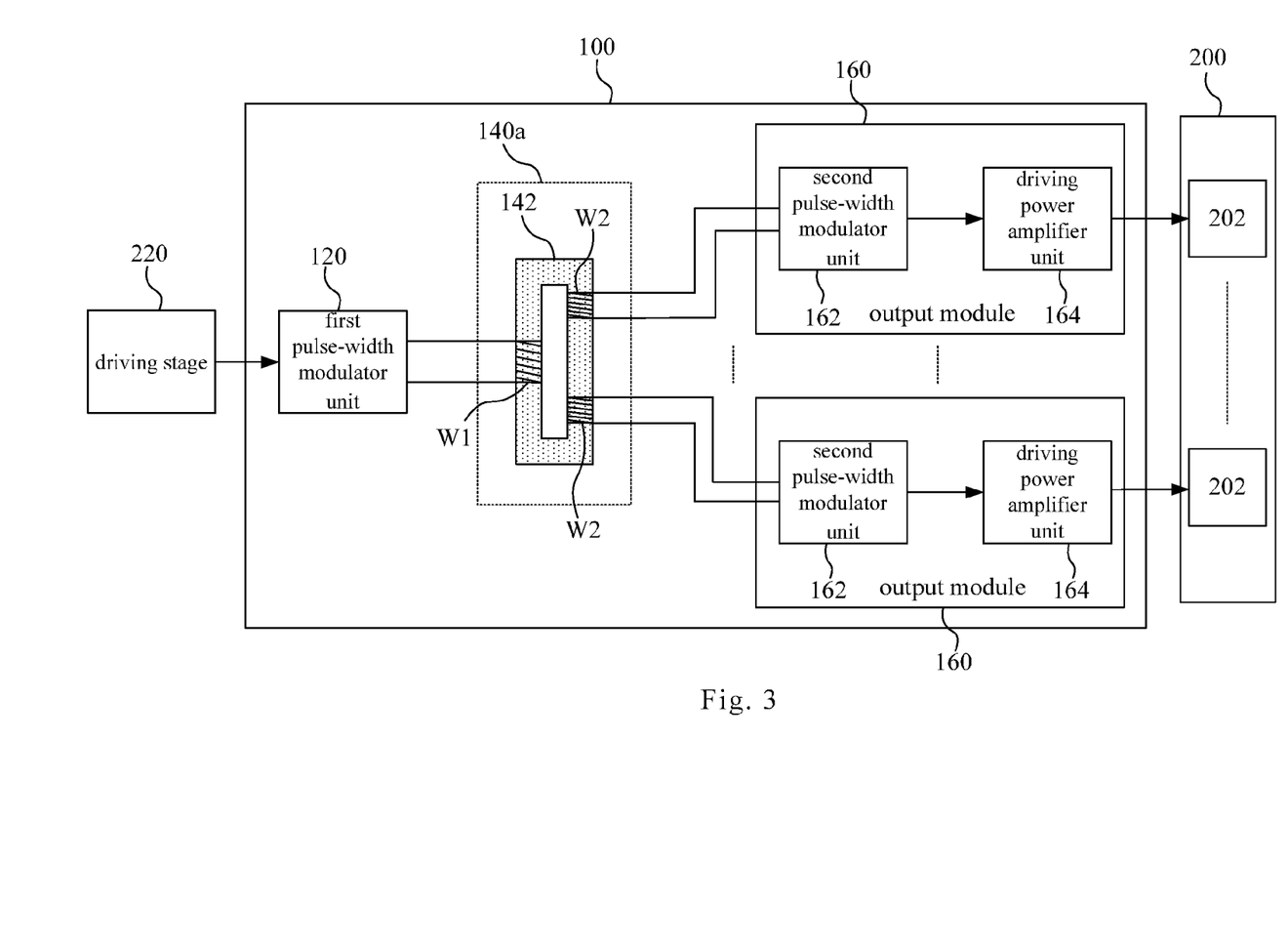
FIG. 3 is a schematic diagram illustrating a structure between a high-voltage isolation pulse transformer module and output modules according to a first embodiment of the invention.

The reference is also made to FIG. 3, which is a schematic diagram illustrating a structure between the high-voltage (HV) isolation pulse transformer module 140a and the output modules 160 according to a first embodiment of the invention. As shown in FIG. 3 in the first embodiment, the high-voltage isolation pulse transformer module 140a (corresponding to the high-voltage isolation pulse transformer module 140 in FIG. 1 and FIG. 2) includes a magnetic core 142, a primary winding W1 and secondary windings W2. The primary winding W1 is wound on the magnetic core 142 and coupled to the first pulse-width modulator 120. The secondary windings W2 are wound on the magnetic core 142 and coupled to the second pulse-width modulators 162 of the output module 160 respectively.

Therefore, the high-voltage isolation pulse transformer module 140a as shown in figures may form the narrow pulse-width signals NPW2 on the secondary side in the electromagnetic induction way from the narrow pulse-width signal NPW1 on the primary side. Then, the narrow pulse-width signals NPW2 are transmitted to the output modules 160. In this case, the magnetic isolation can be formed between the narrow pulse-width signal NPW1 and each narrow pulse-width signal NPW2, and also formed between the narrow pulse-width signals NPW2.

Afterward, the narrow pulse-width signals NPW2 are transformed into the driving control signals DRcon by the driving-power amplifiers 164 in each of the output modules 160. The driving control signals DRcon are amplified by the driving-power amplifiers 164 and form the driving output signals DRout with positive/negative driving levels for the full-controlled power switches 202.

Figure 4:
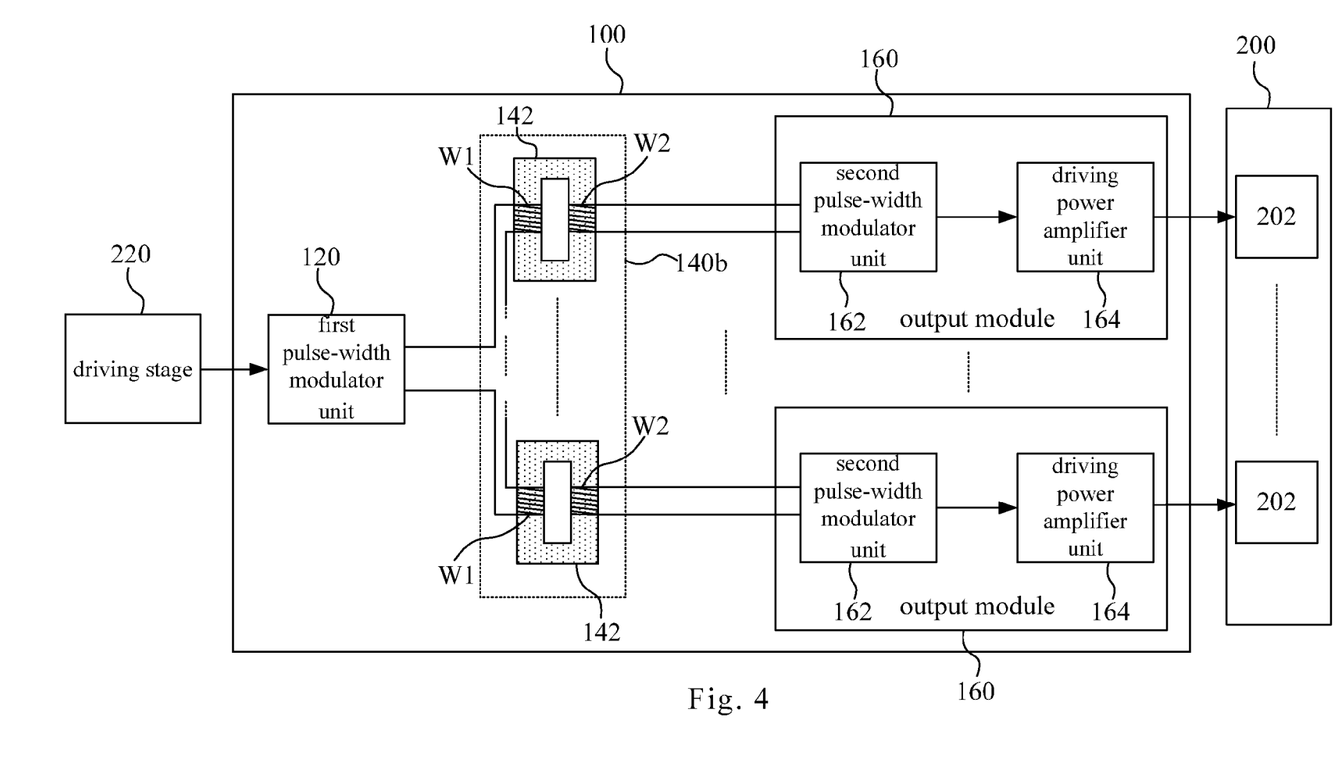
FIG. 4 is a schematic diagram illustrating a structure between the high-voltage isolation pulse transformer module and the output modules according to a second embodiment of the invention.

The reference is also made to FIG. 4, which is a schematic diagram illustrating a structure between the high-voltage isolation pulse transformer module 140b (corresponding to the high-voltage isolation pulse transformer module 140 in FIG. 1 and FIG. 2) and the output modules 160 according to a second embodiment of the invention. As shown in FIG. 4, the high-voltage isolation pulse transformer module 140b in the second embodiment includes magnetic cores 142, primary windings W1 and secondary windings W2. One of the primary windings W1 and one of the secondary windings W2 is wound on each of the magnetic cores 142. In the embodiment shown in FIG. 4, the primary windings W1 are connected in series and coupled to the first pulse-width modulator 120. Each of the output modules 160 includes the second pulse-width modulator 162 and the driving-power amplifier 164. Each of the secondary windings W2 is coupled to the second pulse-width modulator 162 of each of the output modules 160. The driving-power amplifier 164 is coupled between the second pulse-width modulator 162 and one of the full-controlled power switches 202.

Therefore, the high-voltage isolation pulse transformer module 140b may form the narrow pulse-width signals NPW2 on the secondary side in the electromagnetic induction way from the narrow pulse-width signal NPW1 on the primary side. Then, the narrow pulse-width signals NPW2 are transmitted to the output modules 160. In this case, the magnetic isolation can be formed between the narrow pulse-width signal NPW1 and each narrow pulse-width signal NPW2, and also formed between the narrow pulse-width signals NPW2.

Based on aforesaid descriptions, the first embodiment and the second embodiment disclose a driving structure of one magnetic core corresponding to multiple output modules in a one-to-many way, and another driving structure of multiple magnetic cores corresponding to multiple output modules in a one-to-one way.

Some operational examples are demonstrated in the following paragraphs for explaining how to drive and operate a full-controlled power switch combination in this disclosure.

Figure 5:
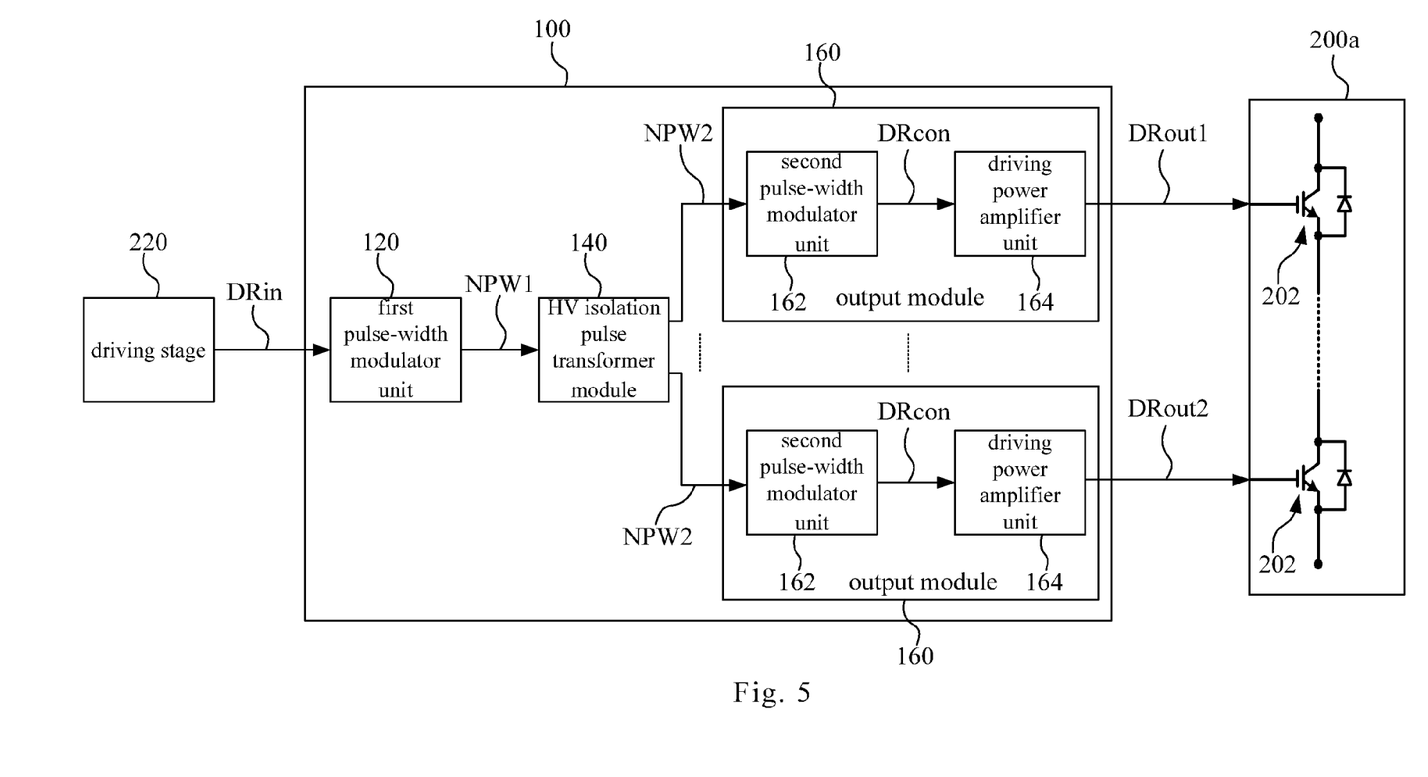
FIG. 5 is a schematic diagram illustrating the switch-driving circuit and a full-controlled power switch combination according to a first operational example of the disclosure.

Reference is made to FIG. 5, which is a schematic diagram illustrating the switch-driving circuit 100 and the full-controlled power switch combination 200a (corresponding to the full-controlled power switch combination 200 in aforesaid embodiments) according to a first operational example of the disclosure.

As shown in FIG. 5 of the first operational example, the full-controlled power switch combination 200a includes the full-controlled power switches 202, which are connected in series. Each of the full-controlled power switches 202 can be an Insulated Gate Bipolar Transistor (IGBT). The output modules 160 generate a plurality of driving output signals DRout1 and DRout2, which are in the same phase and isolated from each other, to the full-controlled power switches 202.

Reference is also made to FIG. 3 and FIG. 4 at the same time, the second pulse-width modulators 162 of each of the output modules 160 in the first operational example in FIG. 5 are coupled to the secondary windings W2 (the secondary windings W2 are wound in the same winding direction), so as to form the driving output signals DRout1 and DRout2 in the same phase.

Figure 6:
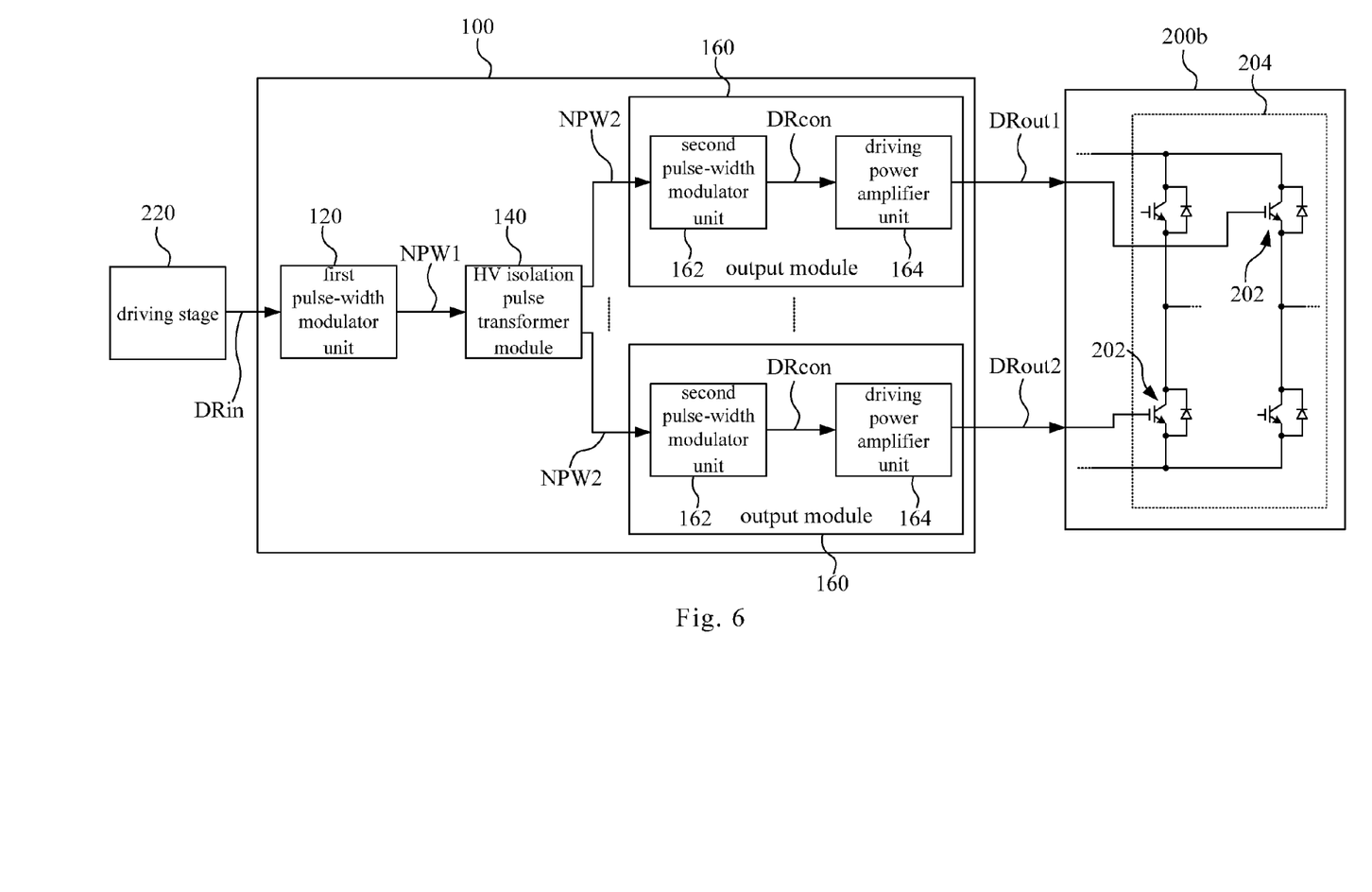
FIG. 6 is a schematic diagram illustrating the switch-driving circuit and a full-controlled power switch combination according to a second operational example of the disclosure.

Reference is made to FIG. 6, which is a schematic diagram illustrating the switch-driving circuit 100 and the full-controlled power switch combination 200b (corresponding to the full-controlled power switch combination 200 in aforesaid embodiments) according to a second operational example of the disclosure.

As shown in FIG. 6 of the second operational example, the full-controlled power switch combination 200b includes the full-controlled power switches 202 connected at opposite sides in a single-phase full-bridge circuit 204 (as an upper switch on one bridge arm and a lower switch on another bridge arm). Each of the full-controlled power switches 202 can be an Insulated Gate Bipolar Transistor (IGBT). The output modules 160 generate a plurality of driving output signals DRout1 and DRout2, which are in the same phase and isolated from each other, to the full-controlled power switches 202 on the opposite sides in the single-phase full-bridge circuit 204 (as shown in FIG. 6), which is operated under single-phase and dual-levels. Similar to the first operating example, the second pulse-width modulators 162 of each of the output modules 160 can be coupled to the terminals with the same polarity on the secondary windings W2 (in addition, the secondary windings W2 are wound in the same winding direction).

Figure 7:
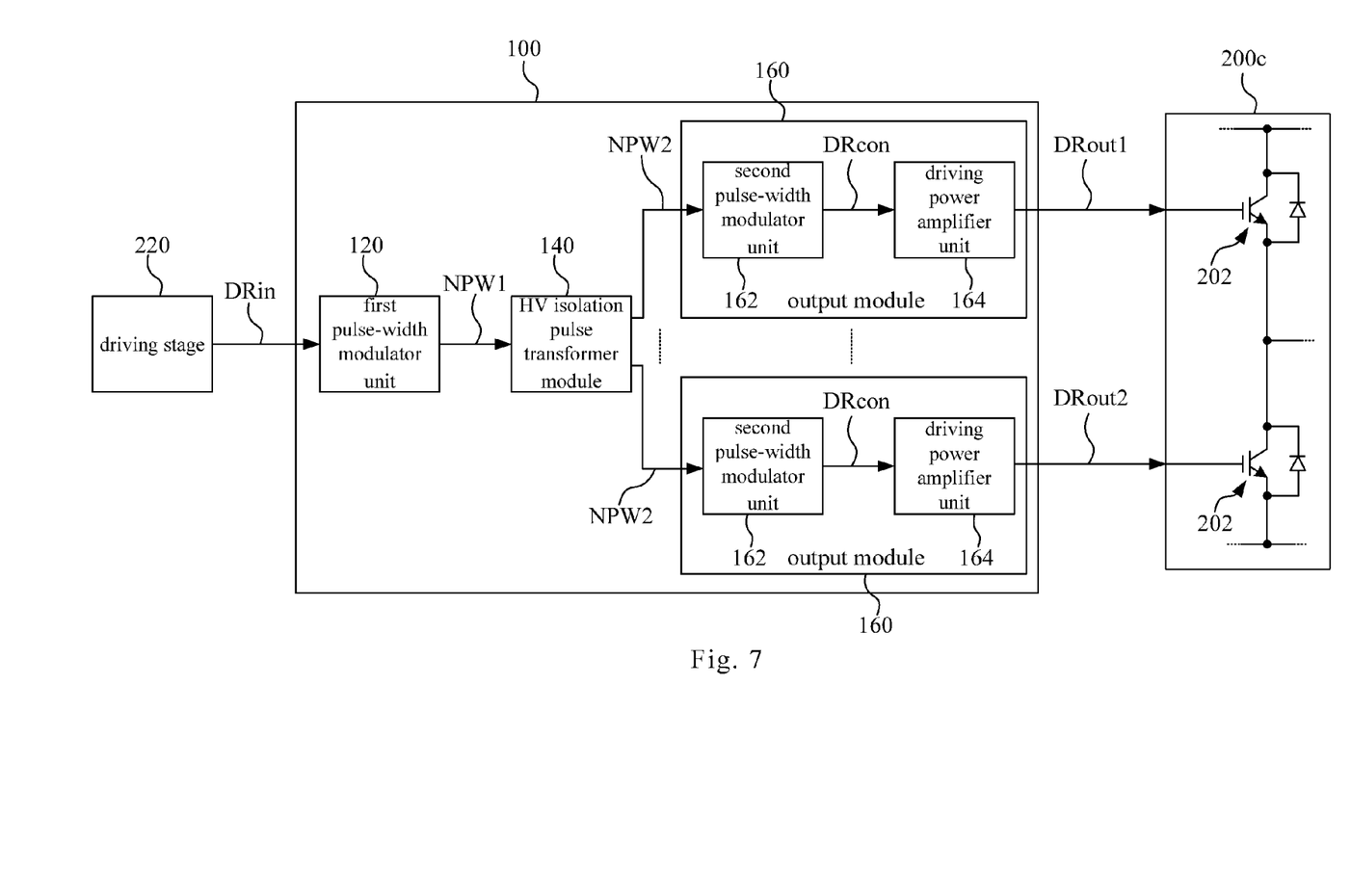
FIG. 7 is a schematic diagram illustrating the switch-driving circuit and a full-controlled power switch combination according to a third operational example of the disclosure.

Reference is made to FIG. 7, which is a schematic diagram illustrating the switch-driving circuit 100 and the full-controlled power switch combination 200c (corresponding to the full-controlled power switch combination 200 in aforesaid embodiments) according to a third operational example of the disclosure.

As shown in FIG. 7 of the third operational example, the full-controlled power switch combination 200c includes two full-controlled power switches 202 connected on two bridge arms in a dual-level bridge arm circuit (as an upper switch on one bridge arm and a lower switch on another bridge arm). Each of the full-controlled power switches 202 can be an Insulated Gate Bipolar Transistor (IGBT).

Based on aforesaid embodiments, this disclosure provides a switch-driving circuit capable of transmitting driving signals to a full-controlled power switch combination in a magnetic isolation way, so as to provide fast-response, stable and reliable driving signals to the full-controlled power switch combination.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A switch-driving circuit, suitable for driving a full-controlled power switch combination, the switch-driving circuit comprising:
   a first pulse-width modulator coupled to an input terminal of the switch-driving circuit, wherein the first pulse-width modulator is configured for transforming a driving input signal transmitted to the input terminal into a narrow pulse-width signal, wherein the driving input signal is a pulse-width modulation signal;
   a high-voltage isolation pulse transformer module comprising a magnetic core, a primary winding and a plurality of secondary windings, the primary winding and the secondary windings being wound on the magnetic core, the primary winding being coupled to the first pulse-width modulator; and
   a plurality of output modules, each output module comprising:
      a second pulse-width modulator, each of the secondary windings being coupled to the second pulse-width modulator respectively; and
      a driving-power amplifier, the driving-power amplifier is coupled between the second pulse-width modulator and the full-controlled power switch combination.

2. The switch-driving circuit of claim 1, wherein the full-controlled power switch combination comprising a plurality of full-controlled power switches, and the driving-power amplifier is coupled to one of the full-controlled power switches.

3. The switch-driving circuit of claim 2, wherein the full-controlled power switches are connected in series, or connected in a single-phase full-bridge circuit as an upper switch on one bridge arm and a lower switch on another bridge arm, the output modules generate a plurality of driving output signals to the full-controlled power switches, the driving output signals are in the same phase and isolated from each other.

4. The switch-driving circuit of claim 1, wherein the narrow pulse-width signal comprises a plurality of positive pulses and a plurality of negative pulses, the positive pulses correspond to a plurality of rising edges of the driving input signal, the negative pulses correspond to a plurality of falling edges of the driving input signal.

5. A switch-driving circuit, suitable for driving a full-controlled power switch combination which comprising a plurality of full-controlled power switches, the switch-driving circuit comprising:
   a first pulse-width modulator coupled to an input terminal of the switch-driving circuit, wherein the first pulse-width modulator is configured for transforming the driving input signal transmitted to the input terminal into a narrow pulse-width signal, wherein the driving input signal is a pulse-width modulation signal;
   a high-voltage isolation pulse transformer module comprising a plurality of magnetic cores, a plurality of primary windings and a plurality of secondary windings, each primary winding and each secondary windings being wound on one of the magnetic cores, the primary windings being coupled to the first pulse-width modulator; and
   a plurality of output modules, each output module comprising:
      a second pulse-width modulator, each of the secondary windings being coupled to the second pulse-width modulator respectively; and
      a driving-power amplifier, the driving-power amplifier is coupled between the second pulse-width modulator and one of the full-controlled power switches.

6. The switch-driving circuit of claim 5, wherein the full-controlled power switches are connected in series, or connected in a single-phase full-bridge circuit as an upper switch on one bridge arm and a lower switch on another bridge arm, the output modules generate a plurality of driving output signals to the full-controlled power switches, the driving output signals are in the same phase and isolated from each other.

7. The switch-driving circuit of claim 5, wherein the narrow pulse-width signal comprises a plurality of positive pulses and a plurality of negative pulses, the positive pulses correspond to a plurality of rising edges of the driving input signal, the negative pulses correspond to a plurality of falling edges of the driving input signal.

* * * * *